(12) United States Patent
Nejad et al.

(10) Patent No.: US 7,440,339 B2
(45) Date of Patent: Oct. 21, 2008

(54) STACKED COLUMNAR 1T-NMTJ MRAM STRUCTURE AND ITS METHOD OF FORMATION AND OPERATION

(75) Inventors: Hasan Nejad, Boise, ID (US);
Mirmajid Seyyedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 11/142,448

(22) Filed: Jun. 2, 2005

(65) Prior Publication Data
US 2005/0226038 A1 Oct. 13, 2005

Related U.S. Application Data

(62) Division of application No. 10/784,786, filed on Feb. 24, 2004, now Pat. No. 7,023,743, which is a division of application No. 10/214,167, filed on Aug. 8, 2002, now Pat. No. 6,882,553.

(51) Int. Cl.
*G11C 7/10* (2006.01)
(52) U.S. Cl. .................. 365/189.08; 365/46; 365/63; 365/100
(58) Field of Classification Search ............ 365/189.08, 365/46, 63, 100
See application file for complete search history.

(56) References Cited

U.S. PATENT DOCUMENTS

| | | | | | |
|---|---|---|---|---|---|
| 3,699,535 | A | * | 10/1972 | Klein | 711/137 |
| 3,944,800 | A | * | 3/1976 | Beck et al. | 714/820 |
| 4,425,633 | A | * | 1/1984 | Swain | 365/194 |
| 5,594,698 | A | * | 1/1997 | Freeman | 365/222 |
| 5,969,380 | A | * | 10/1999 | Seyyedy | 257/295 |
| 6,004,825 | A | * | 12/1999 | Seyyedy | 438/3 |
| 6,212,109 | B1 | | 4/2001 | Proebsting | |
| 6,337,287 | B1 | * | 1/2002 | Bozso et al. | 438/745 |
| 6,349,054 | B1 | | 2/2002 | Hidaka | |
| 6,373,753 | B1 | | 4/2002 | Proebsting | |
| 6,483,736 | B2 | * | 11/2002 | Johnson et al. | 365/130 |
| 6,570,795 | B1 | | 5/2003 | Fricke et al. | |
| 6,574,135 | B1 | * | 6/2003 | Komatsuzaki | 365/145 |
| 6,577,529 | B1 | | 6/2003 | Sharma et al. | |

(Continued)

FOREIGN PATENT DOCUMENTS

JP 2002170376 6/2002

(Continued)

OTHER PUBLICATIONS

How Magnetic RAM Will Work <http://www.howstuffworks.com/mram2.htm>.

(Continued)

*Primary Examiner*—Viet Q Nguyen
(74) *Attorney, Agent, or Firm*—Dickstein Shapiro LLP

(57) ABSTRACT

This invention relates to an MRAM array architecture which incorporates certain advantages from both cross-point and 1T-1MTJ architectures during reading operations. The fast read-time and higher signal to noise ratio of the 1T-1MTJ architecture and the higher packing density of the cross-point architecture are both exploited by using a single access transistor to control the reading of multiple stacked columns of MRAM cells each column being provided in a respective stacked memory layer.

9 Claims, 8 Drawing Sheets

U.S. PATENT DOCUMENTS

| | | | |
|---|---|---|---|
| 6,606,705 B1 * | 8/2003 | Volk | 713/100 |
| 6,631,085 B2 | 10/2003 | Kleveland et al. | |
| 6,643,159 B2 * | 11/2003 | Fricke et al. | 365/51 |
| 6,671,213 B2 | 12/2003 | Ohtani | |
| 6,680,862 B2 | 1/2004 | Hidaka | |
| 6,680,863 B1 | 1/2004 | Shi et al. | |
| 6,693,825 B1 | 2/2004 | Sharma et al. | |
| 6,717,222 B2 | 4/2004 | Zhang | |
| 6,724,653 B1 | 4/2004 | Iwata et al. | |
| 6,741,513 B2 * | 5/2004 | Honigschmid et al. | 365/230.03 |
| 6,754,124 B2 * | 6/2004 | Seyyedy et al. | 365/214 |
| 6,756,652 B2 | 6/2004 | Yano et al. | |
| 6,778,434 B2 | 8/2004 | Tsuji | |
| 6,781,858 B2 * | 8/2004 | Fricke et al. | 365/51 |
| 6,829,188 B2 | 12/2004 | Baker | |
| 6,876,575 B2 | 4/2005 | Hidaka | |
| 6,879,516 B2 * | 4/2005 | Nejad et al. | 365/171 |
| 6,882,553 B2 * | 4/2005 | Nejad et al. | 365/63 |
| 6,882,566 B2 * | 4/2005 | Nejad et al. | 365/173 |
| 6,906,941 B2 * | 6/2005 | Tran et al. | 365/66 |
| 6,917,532 B2 * | 7/2005 | Van Brocklin et al. | 365/51 |
| 7,023,743 B2 * | 4/2006 | Nejad et al. | 365/189.08 |
| 2001/0012228 A1 | 8/2001 | Perner | |
| 2001/0038548 A1 | 11/2001 | Perner | |
| 2003/0223292 A1 | 12/2003 | Nejad et al. | |
| 2004/0089913 A1 | 5/2004 | Yano et al. | |

FOREIGN PATENT DOCUMENTS

| | | |
|---|---|---|
| JP | 20044319725 A | 11/2004 |
| WO | WO-0241321 | 5/2002 |

OTHER PUBLICATIONS

MTJ Based MRAM System Design <http://www.aps.org/meet/MAR01/baps/abs/S2550004.html>.

Motorola Demonstrates Revolutionary Memory Technology <http://www.apspg.com/press/060100/mram-final.html>.

Computing Unplugged <http://www.research.ibm.com/thinkresearch/pages/2001/20010202_mram.shtml>.

Magnetic Tunnel Junction Materials for Electronic Applications <http://www.tms.org/pubs/journals/JOM/0006/Slaughter/Slaughter-0006.html>.

Magneto-Electronics: Magnetic Tunnel Junctions <http://www.almaden.ibm.com/st/projects/magneto/mtj/>.

* cited by examiner

STACKED COLUMNAR 1T-/MTJ MRAM STRUCTURE AND ITS METHOD OF FORMATION AND OPERATION

This is a division of application Ser. No. 10/784,786, filed Feb. 24, 2004, now U.S. Pat. No. 7,023,743, which is a division of application Ser. No. 10/214,167, filed Aug. 8, 2002, now U.S. Pat. No, 6,882,553, which are incorporated herein by reference in their entirety.

FIELD OF THE INVENTION

The present invention relates to magnetoresistive random access memory (MRAM) devices and, more particularly, to read circuitry for such devices.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure which includes ferromagnetic layers separated by a non-magnetic barrier layer that forms a tunnel junction. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "anti-parallel" states relative to the pinned layer. In response to parallel and anti-parallel states, the magnetic memory element represents two different resistance states, which are read by the memory circuit as either a "1" or a "0." It is the detection of these resistance states for the different magnetic orientations that allows the MRAM to read binary information.

There are different array architectures that are used within MRAM technology to read memory cells. One architecture which is used is the so-called one transistor—one magnetic tunnel junction per cell ("1T-1MTJ") architecture. This structure is based on a single access transistor for selecting a magnetic memory element for a read operation. Another architecture is the cross-point architecture, where a cell is selected and a read operation performed without using an access transistor. This type of system uses row and column lines set to a predetermined voltage levels to read a selected cell. Each system has its advantages and disadvantages. The cross-point system is somewhat slower in reading than the 1T-1MTJ system, as well as having a lower signal to noise ratio during a read operation; however, the cross-point array has the advantage that such arrays can be easily stacked within an integrated circuit for higher density. The 1T-1MTJ array is faster, has a better signal to noise ratio, but is less densely integrated than a cross-point array.

It would be desirable to have an MRAM read architecture that could utilize advantages from both the 1T-1MTJ and cross-point architectures, while minimizing the disadvantages of each.

SUMMARY

This invention provides an MRAM array read architecture which incorporates certain advantages from both cross-point and 1T-1MTJ architectures. The fast read-time and high signal to noise ratio of the 1T-1MTJ architecture and the higher packing density of the cross-point architecture are both exploited in the invention by uniquely combining certain characteristics of each. An access transistor is used to select for reading multiple columns of MRAM cells, which are stacked vertically above one another in a memory slice of a memory array. In this architecture, the plurality of columns of MRAM cells share a common sense line. A specific MRAM cell within the multiple columns is accessed by a row and plane address during a read operation.

The invention also provides a method of fabricating an MRAM memory device having the characteristics noted in the preceding paragraph and a method of operating the memory device to read a selected memory cell. These and other features and advantages will become more apparent from the following detailed description of the invention which is provided in conjunction with the accompanying drawings.

BRIEF DESCRIPTION OF THE DRAWINGS

FIG. 2b is a perspective cross-sectional illustration of an MRAM slice of an MRAM array, constructed in accordance with FIG. 2a;

FIG. 2c is a perspective cross-sectional illustration of an MRAM array layer of an MRAM array, constructed in accordance with FIG. 2a;

FIG. 2d is an illustration of an MRAM column of an MRAM array, constructed in accordance with FIG. 2a;

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

Figure 1:
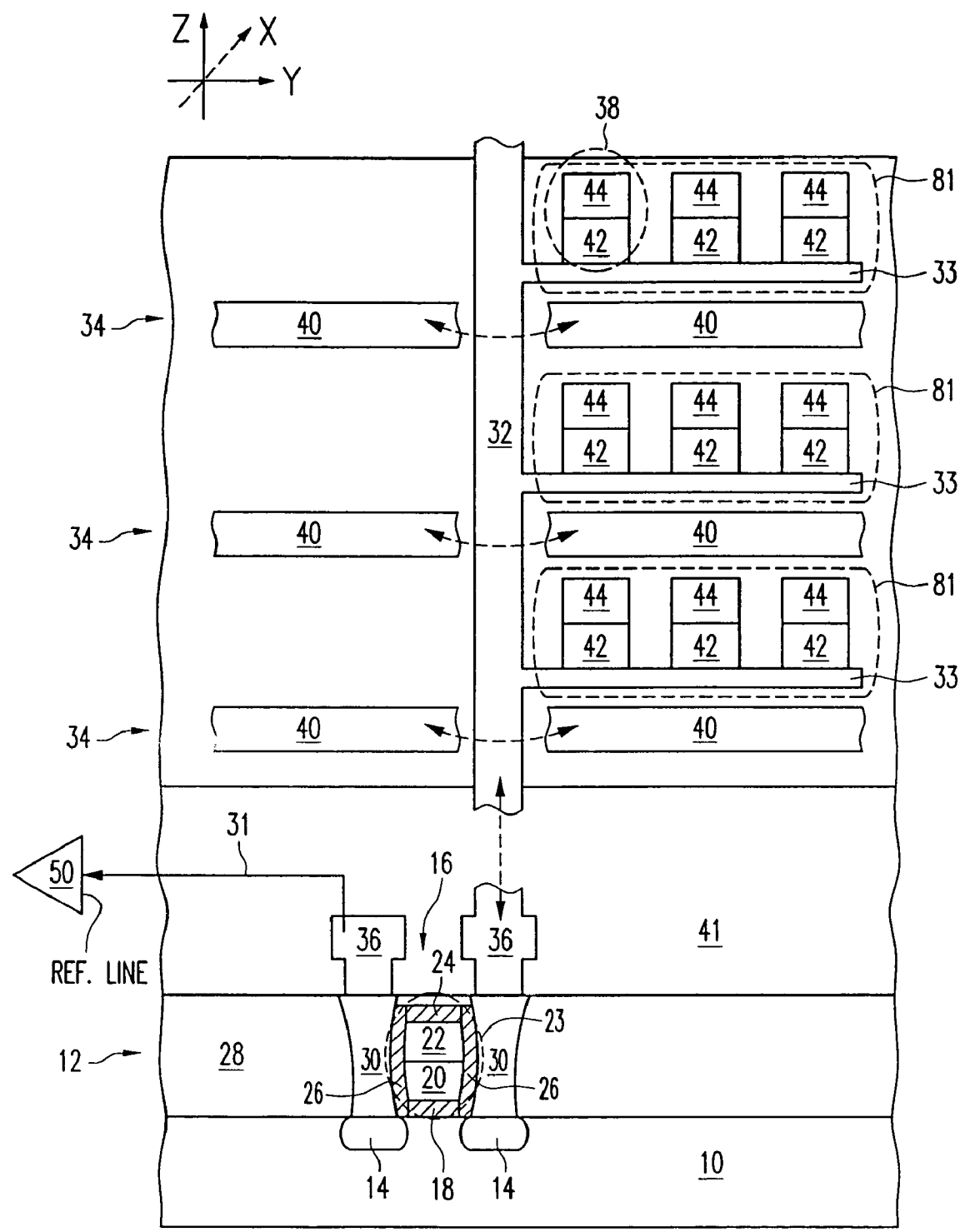
FIG. 1 is a two-dimensional cross-sectional view of a portion of an MRAM array, constructed in accordance with an exemplary embodiment of the invention.
Figure 2A:
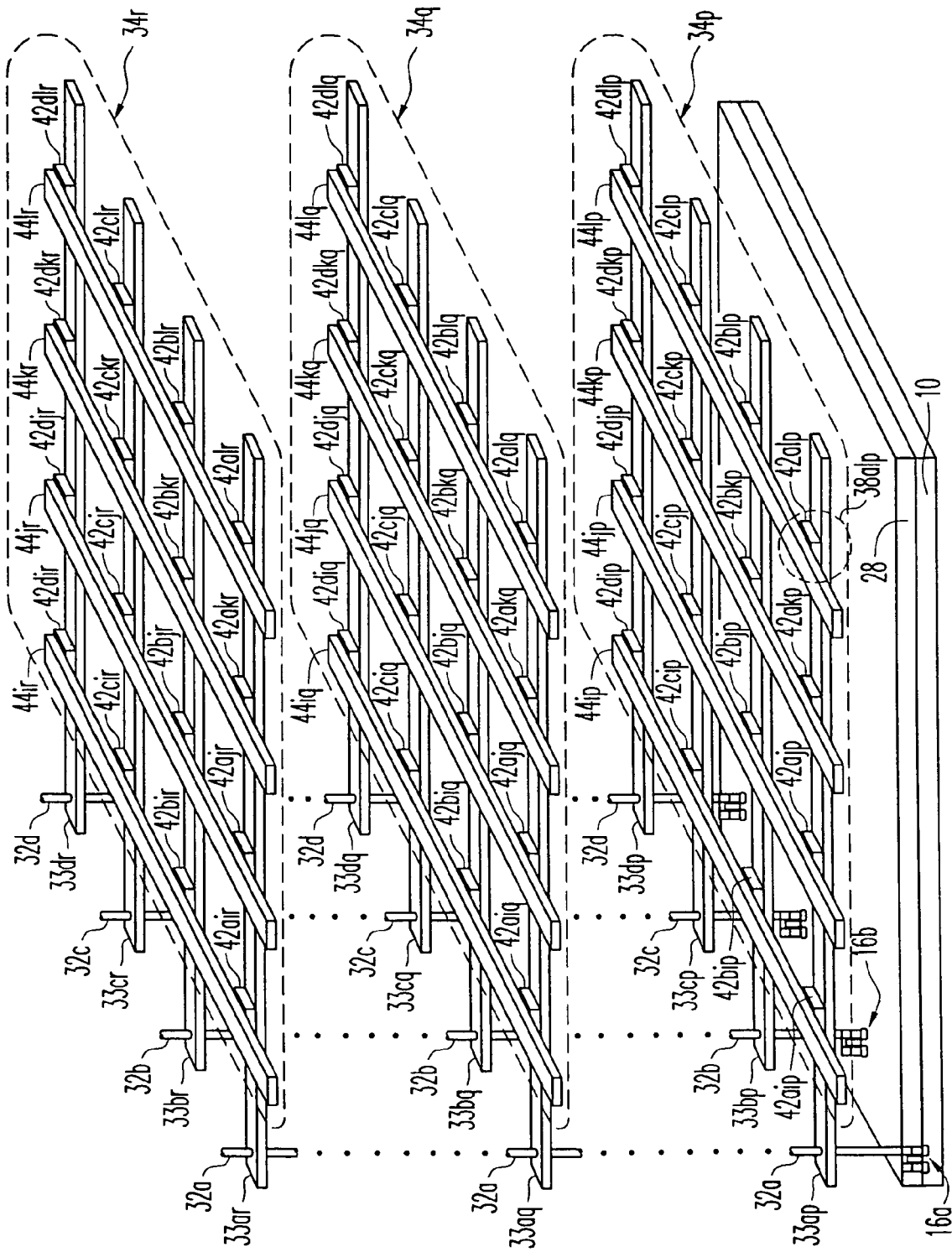
FIG. 2a is a perspective cross-sectional illustration of a portion of a MRAM array constructed in accordance with the embodiment shown in FIG. 1.

The fast read-time and high signal to noise ratio of the 1T-1MTJ architecture and the higher packing density of the cross-point architecture are both exploited by combining certain characteristics of each layout in the invention. As shown in FIGS. 1 and 2a . . . 2d, the array architecture of the invention has a plurality of MRAM memory arrays 34 stacked one over another. Each array 34 includes a plurality of rows and columns of memory cells. All of the memory cells in the corresponding column in each of the stacked arrays form a memory slice 80 and are coupled to a single access transistor 16 as a group.

The access transistor 16 is used to control the reading of multiple MRAM cells 38, arranged in columns 81, one from each array layer 34, which are stacked substantially above one another in the "Z" axis direction. Thus, each access transistor 16 is connected to a substantially vertical stack of columns 81 of MRAM cells 38 arranged substantially above it. The plurality of columns 81 in this "Y-Z" direction have respective sense lines 33 which are interconnected by virtue of a sense line interconnect 32. This architecture is represented in two-dimensions in FIG. 1 and in three-dimensions in FIGS. 2a, 2b, 2c, and 2d. The "X,", "Y," and "Z" axes are shown in each figures.

Now referring more specifically to the figures, where like reference numbers designate like elements, FIG. 1 shows a plurality of stacked planar memory cell array layers 34. Each layer 34 has a plurality of memory cells 38 arranged in rows, defined by read/write row lines 44, and columns, defined by sense lines 33 and write only column lines 40 (FIG. 2a). An access transistor layer 12 is fabricated on a semiconductor substrate 10 below the array layers 34. The access transistor layer 12 includes a plurality of access transistors 16 arranged along the "X" axis direction corresponding to the direction in which the row lines 44 extend in each memory array layer 34.

As shown in FIG. 1, each access transistors 16 can be typical N-channel MOSFET (metal oxide semiconductor field effect transistor), though the specific structure of the access transistor 16 is not crucial to the invention. The transistor 16 includes source/drain regions 14 in the substrate 10. Each transistor 16 further includes a gate oxide 18, and over this a polysilicon gate layer 20 with an overlying silicide layer 22, all topped by a nitride cap 24. The polysilicon layer 20 and silicide layer 22 together form a control line 23 which continues in the "X" axis direction in the manner best shown in FIG. 3. The sides of the access transistor 16 control line 23 are insulated and protected by insulating sidewalls 26, made of an oxide or nitride material. The control line 23 of the access transistor 16 can be connected to a decoding circuit with peripheral circuitry 48 (depicted in FIG. 4). Access transistor 16 can be fabricated by any techniques well known to those skilled in the art.

Still referring to FIG. 1, an insulating dielectric layer 28 is formed over and around the access transistor 16. Through this insulating dielectric layer 28 conductive plugs 30 are fabricated which connect to the source/drain regions 14. The insulating dielectric 28 can be any material known in the art, such as an oxide or BPSG, and can be formed according to methods well known in the art. The conductive plugs 30 similarly can be any conductive material well known in the art, but preferably are polysilicon or tungsten, and can be formed by known methods. One of the conductive plugs 30 serves to connect one of the source and drain regions 14 to the column sense lines 33 of the stacked MRAM array layers 34, while the other conductive plug connects the other of the source and drain regions 14 to a sense amplifier 50 used during the reading of MRAM cells 38. The connections between each access transistor 16 and the MRAM array layers 34 and the bit lines 31 are typically formed as metal interconnects 36, provided within insulating layer 41. The metal interconnects 36 and bit lines 31 can be copper, aluminum, or any other metal or other conductor known as suitable in the art, and can be formed by known methods.

Figure 2B:
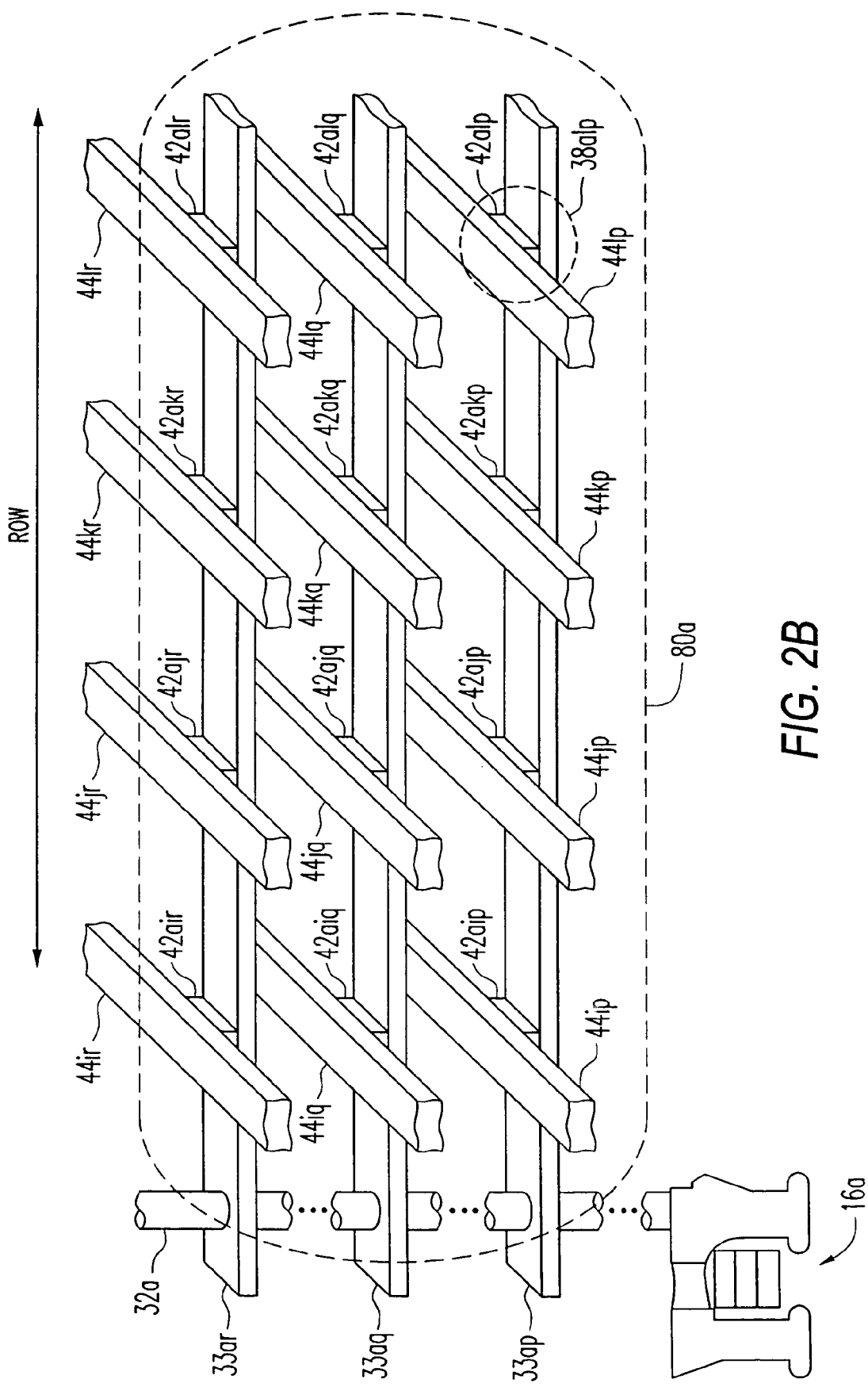
Figure 2C:
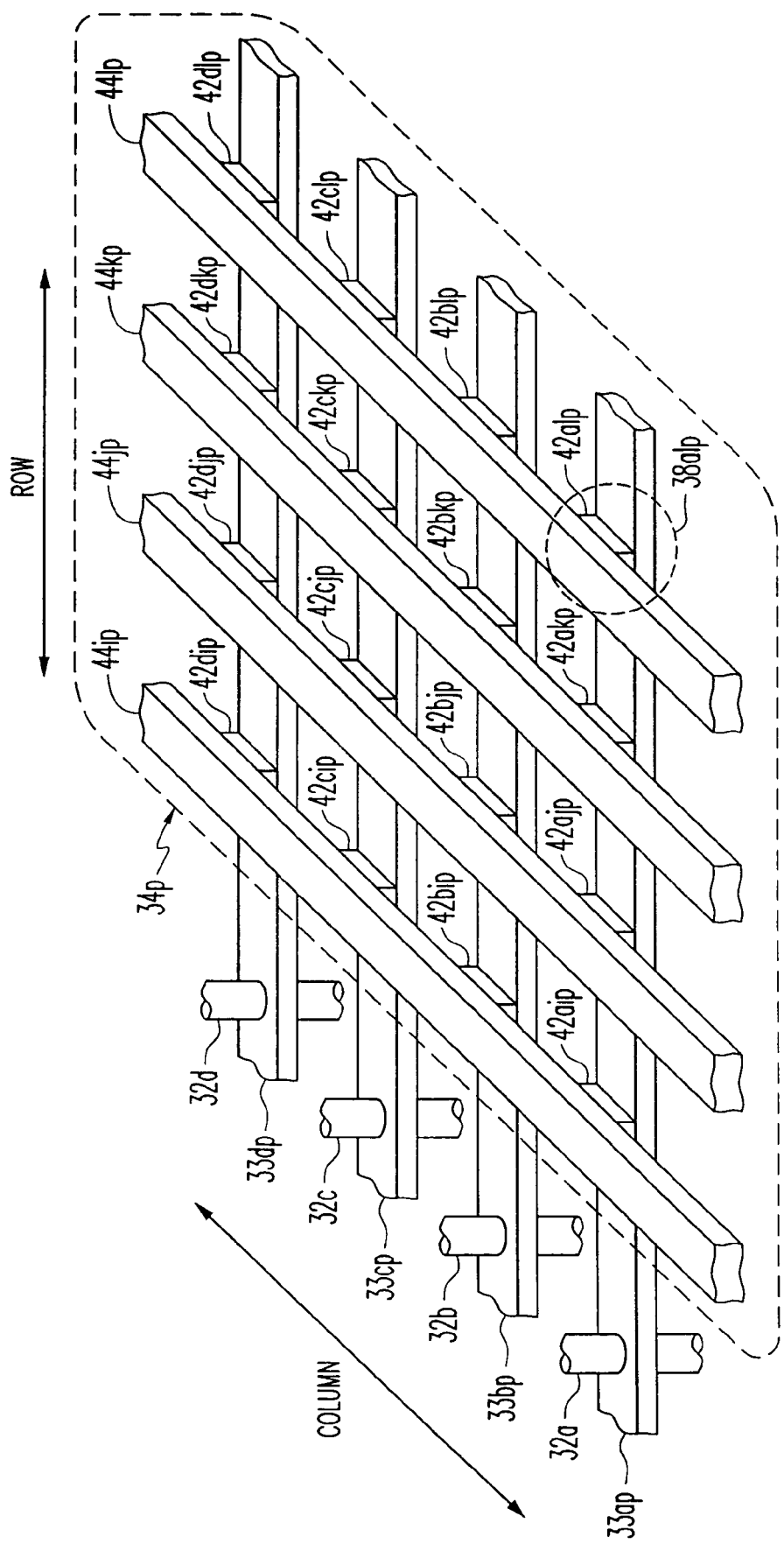
Figure 2D:
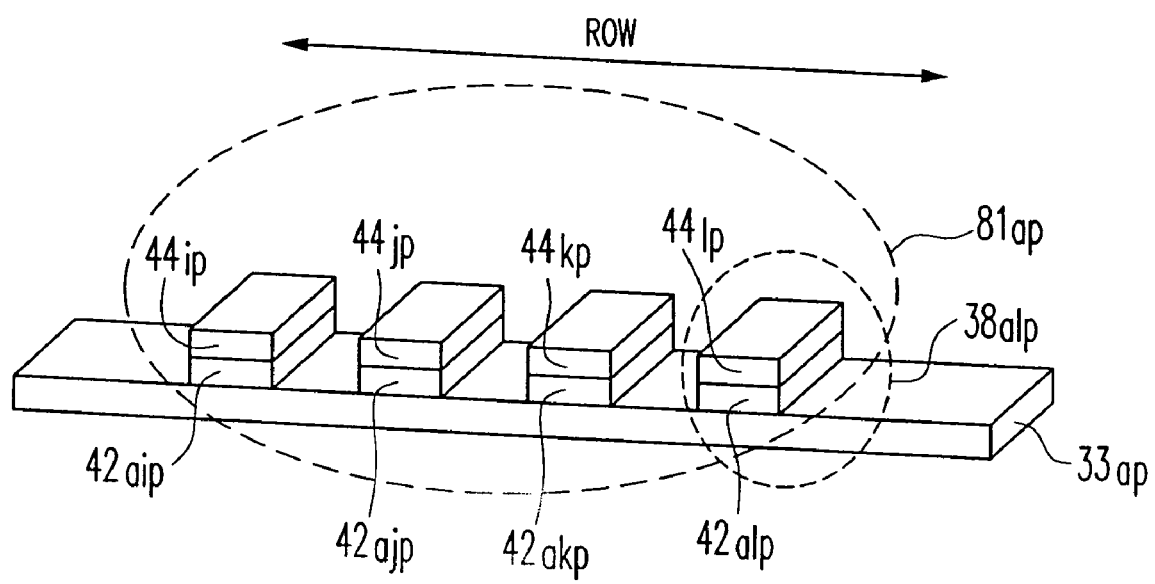
Figure 3:
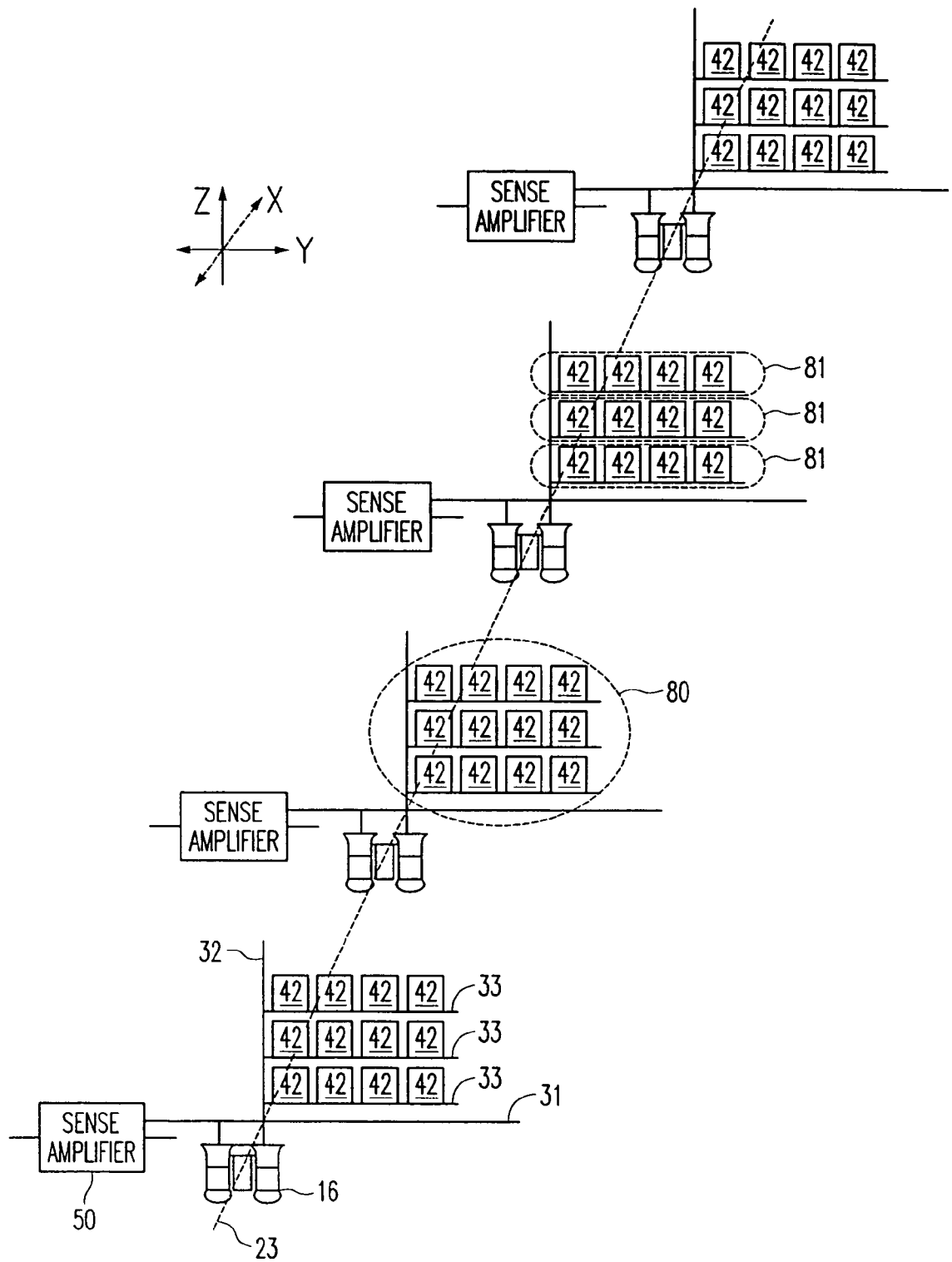
FIG. 3 is a three dimensional block diagram and representational illustration of the FIGS. 1 and 2a-d MRAM array.

As further shown in FIG. 2a, the MRAM cells 38 are arranged in rows and columns in each array layer 34, and each array layer 34 is arranged in a stacked fashion over substrate 10. MRAM cells 38 are arranged in two-dimensional arrays (in the "X, Y" plane) in each array layer 34, where each cell 38 is defined at the intersection of a row read/write line 44 and a column sense line 33, which are orthogonal to each other, as shown in FIGS. 2a, 2b, and 2c. The stacked columns 81 of cells 38 from each array layer 34 form a memory slice 80, that is, a plane of cells in the Y-Z direction, as shown in FIG. 2b. In the figures a, b, c, d are used to reference structures laid out in the X axis (column) direction, i, j, k, l are used to reference structures laid out in the Y axis (row) direction, and p, q, r are used to reference structures laid out in the Z axis (stacked array 34 direction) direction. Accordingly, the ath memory slice (i.e, memory slice 80a) is formed by the ath columns 81 of memory cells 38 of each array layer 34. Therefore, memory slices 80 taken in the Y-Z direction are orthogonal to the memory array layers 34 which are formed in the X-Y direction. Each sense line 33 in a common memory slice 80 is coupled to a plurality of MRAM cells 38 arranged in a respective column 81 of a layer 34 (FIG. 2d), in a Y axis direction. This can best be seen in the three-dimensional perspective of FIG. 3. The sense lines 33 for a memory slice 80 are also interconnected by a vertical metal interconnect 32 (FIGS. 1-3). FIG. 1 also shows a write only column line 40 for each column 81 of memory cells 38 in each array 34, which may be provided to assist in writing memory cells 38. The write only lines 40 are omitted in FIGS. 2a-d and 3 for clarity, although they are shown in simplified format in FIG. 4.

FIG. 3 shows four memory slices 80 arranged in the X axis direction, where each memory slice 80 contains four columns 81 of memory cells 42 stacked in a vertical direction. Each memory slice 80 has an associated access transistor 16, bit line 31 and sense amplifier 50.

Figure 4:
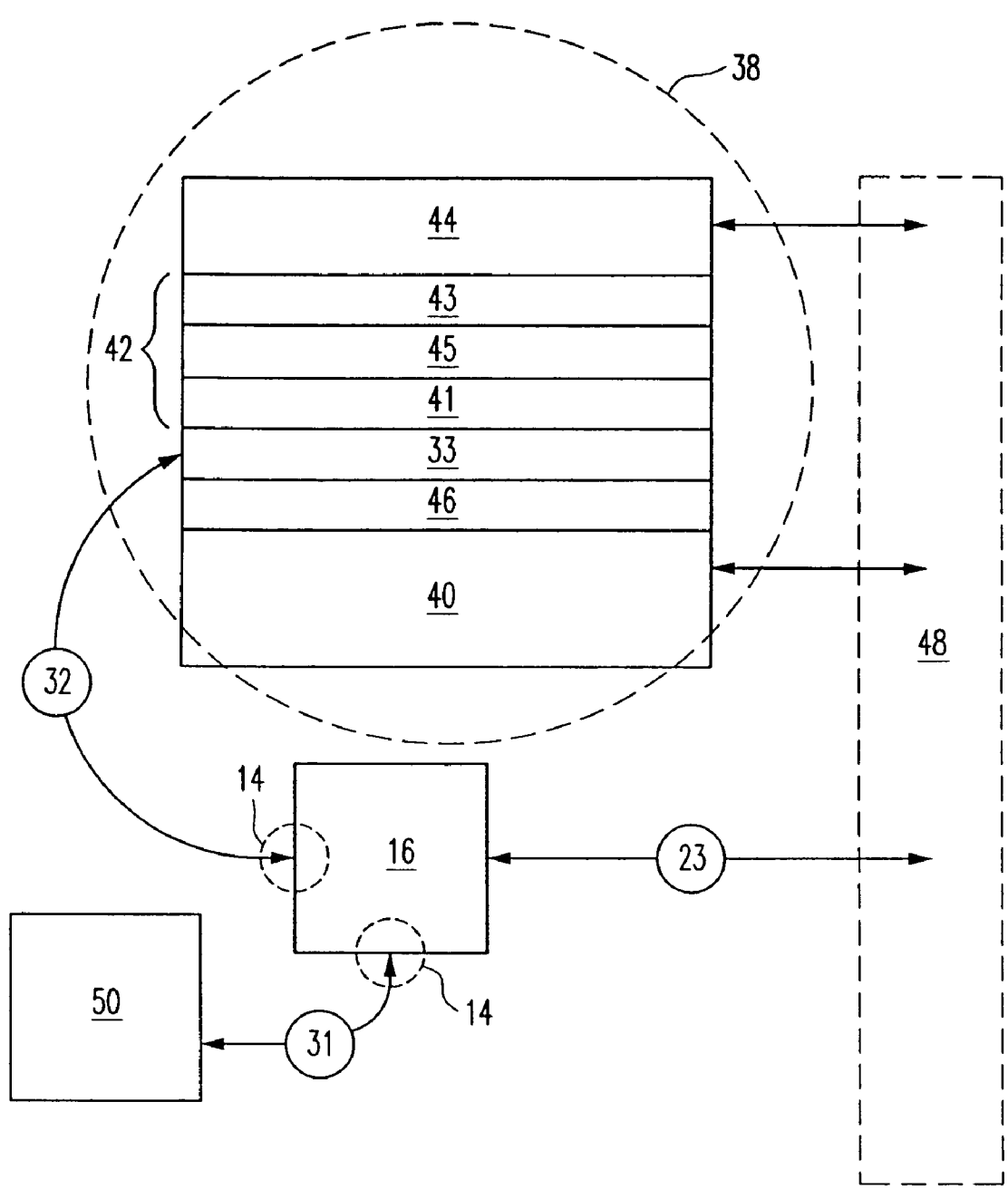
FIG. 4 is a block diagram and representational illustration of an MRAM memory cell showing the interaction between the layers of the cell and other circuitry.

Referring to FIG. 4, each MRAM cell 38 has, in its most basic configuration, the common read/write row line 44, used for both the reading and writing functions, a magnetic bit 42, a column sense line 33 used for the reading function, and a column write-only line 40 used for the writing function, which is separated from the sense line 33 by a dielectric layer 46. The magnetic bit 42 includes a free ferromagnetic structure 43, a tunnel junction layer 45, and a pinned ferromagnetic structure 41. In the illustrated embodiment, the free ferromagnetic structure 43 is above the pinned ferromagnetic structure 41, which is adjacent the sense line 33; however, it is possible to invert the arrangement of the pinned and free ferromagnetic structures as is known in the art.

The MRAM cells 38 which are coupled through sense lines 33 from respective array layers 34 and share a sense line interconnect 32 are in a memory slice 80 in the "Y-Z" direction, which is vertical relative to the access transistor 16 as shown in FIG. 3. However, other configurations are possible, so long as a plurality of sense lines 33, corresponding to a column 81 of memory cells 38 in each array 34, is connected to the common vertically arranged sense line interconnect 32.

The write-only column line 40 of each MRAM cell 38 can be composed of conductive materials as known in the art; the particular combination of materials making up the write-only line is not a critical element of the invention; however, as an example this line 40 can be copper or aluminum, and is insulated from other conductive structures by dielectric layer

46. Though shown in segments in FIG. 1, the write-only column lines 40 actually are continuous and travel around the sense line interconnects 32, as shown by the dashed arrows in FIG. 1.

Shown most clearly in FIG. 4, above the write-only line 40 is the sense line 33, which will be further described below, and the magnetic bit 42, which is in contact with the common read/write line 44. The pinned ferromagnetic structure 41 includes an associated anti-ferromagnetic layer (not shown), such as iron manganese, which keeps the magnetic orientation of this layer 41 fixed, i.e., "pinned." The pinned ferromagnetic structure 41 can be formed of layers of ferromagnetic having good magnetic properties, such as nickel iron cobalt or nickel iron, for instance. The tunnel junction 45 is a non-magnetic region separating the two ferromagnetic structures 41 and 43. The tunnel junction 45 can be made of many materials, as is known in the art, but the preferred material is aluminum oxide. Over the tunnel junction 45 is the free ferromagnetic structure 43, which also can be made of a plurality of ferromagnetic layers. Unlike the pinned ferromagnetic structure 41, the free ferromagnetic structure 43 is free to shift its magnetic orientation during the writing of the MRAM cell 38 and has no associated anti-ferromagnetic layer. The free ferromagnetic structure 43 is in electrical contact with a common read/write row line 44.

Referring again to FIG. 1, a nitride passivation layer is typically provided over the uppermost array layer 34 to protect the MRAM device. There is no restrictive limit on the number of MRAM array layers 34 which may be used, other than the practicality of physical size of the ultimate device. In general, ten or more layers 34 are feasible. Of course, a lesser number of layers 34 can also be used. Likewise, the only limit on the number of Y-Z axis memory slices 80 arranged in the X axis direction and the number of memory cells 38 contained in each memory slice 80 is the practicality of physical size of the ultimate device.

In the architecture of the invention, a single access transistor 16 is shared by each of the MRAM cells 38 within a memory slice 80 in the "Y-Z" planar direction of the stacked layers 34 substantially above the access transistor 16.

Each access transistors 16 can be connected to a corresponding sense amplifier 50 in various ways. For instance, each access transistor 16 can be electrically coupled with a single respective bit line 31 and that bit line 31 can be electrically coupled as one input to a single respective sense amplifier 50 which has another input receiving a reference voltage or, alternatively, multiple bit lines 31 associated with respective access transistors 16 can be electrically coupled through a switch circuit and share a single sense amplifier 50.

During a write operation an MRAM cell 38 is addressed by the coinciding activation of the common read/write row line 44 and a write-only column line 40 in a selected array layer 34 associated with that cell 38 by peripheral logic circuitry. Thus, the peripheral logic 48 performs a row, column and array layer decode to select a cell 38 for a writing operation. The actual writing of memory is performed, as is known in the art, as a function of magnetic moments produced by the electric currents of the common read/write row line 44 and write only column line 40 causing the free ferromagnetic structure 43 to obtain a particular magnetic orientation depending on the direction of current flow through the read/write row line 44 and the write only column line 40.

To read stored information in an MRAM cell 38, a cell 38 in the Y-Z plane of memory cells is accessed by applying an appropriate voltage to a read/write row line 44 of a selected planar array 34 relative to other read/write row lines 44 in the selected planar array and by activating the access transistor 16 associated with the Y-Z plane (column) of cells containing the selected cell. Thus, a cell 38 in the three-dimensional array (as shown in FIG. 3) is addressed for reading in "X" axis direction by column decode signal which turns on access transistor 16, and in the "Y-Z" planar direction by a selected common read/write row line 44 activated by a row decode signal. A decoded plane address signal selects one of the planar layers 34 to which the decoded row signal is applied.

When turned on, the access transistor 16 connects a sense amplifier 50 (connected to the source/drain 14 of the transistor 16 by the bit line 31) to a sense line interconnect 32 (connected to the other source/drain 14 of the access transistor 16) associated with the sense lines 33 of a MRAM cell 38 associated with a plurality of columns in the associated memory slice 80 in the "Y-Z" planar direction over that transistor 16. When a cell is read, the sense amplifier 50 connected to the access transistor 16 senses the logic state stored in the read cell as a resistance by any method well known in the art.

Conventional row decoding techniques can be used to activate a read/write line 44 to select a row of MRAM cells 38 in each an array layer 34. Additional address bits are decoded and used to select one of the array layers 34. For the three array layers 34 shown in FIGS. 1, 2a-c and 3, this would require two additional address bits which can be added to the row or column address bits. During a read, the column addresses are used to select an access transmitter 16, corresponding to a memory slice 81. Once the row and column addresses have been received in the MRAM device, they are decoded to activate an addressed row, column, and array layer 34. As one example, if the MRAM device is a 16 Mbit array organized as 2048 rows by 2048 columns by 4 layers 34, the memory device would utilize an 11-bit ($2^{11}$=2048) row address and a 13-bit column address, with 11 of the 13 bits used for a column selection ($2^{11}$=2048) and the two remaining column bits used for planar array 34 selection ($2^2$=4).

Once an MRAM cell 38 has been addressed for a read operation, the addressed cell 38 is coupled to one of the inputs of a sense amplifier 50 via a sense line 33, a sense line interconnect 32, an access transistor 16, and a bit line 31. The other input of the sense amplifier 50 is coupled to another one of the non-addressed lines 31 to use as a reference, or to a reference voltage. The sense amplifier 50 senses the resistance of the selected cell 38 connected to one input of the sense amplifier 50 using the other input of the sense amplifier 50 as a reference.

This architecture provides for a transistor driver (the access transistor 16) for the reading function which is close to both the MRAM cells 38 and the sense amplifier 50 enabling a faster read function. This arrangement also produces a higher signal to noise ratio during the read function than is provided by a conventional cross-point architecture. In this arrangement, the MRAM three-dimensional array essentially consists of an 1T-nMTJ architecture, where n is equal to the number of MRAM cells 38 in the memory slice 80 in the "Y-Z" planar direction. Accordingly, fewer access transistors 16 are required than is needed in the 1T-1MTJ architecture known in the art.

An MRAM array employing the invention is formed using conventional processing techniques commonly known in the art. A layer 12 of fabrication access transistors, each having a gate and source drain region is formed over a substrate. Sense amplifier circuitry is also formed in the same layer along with other periphery circuitry such as row, column, and plane decoders. The transistor layer is covered by one or more fabricator insulating layers 28. Conductive paths are formed through the insulating layer 28 and additional insulating layer 41 is provided over the insulating layer 28. Planar memory array layers 34 are sequentially formed one over another; each layer 34 contains a plurality of rows and columns of memory cells. A conductive path 36, including interconnect 32, is formed from one of one source/drain regions of each transistor 16 to memory cells of stacked columns of cells in a manner commonly known in the art. In a preferred embodiment, the memory cells are MRAM cells that formed by different layers of materials as commonly known and discussed above. The other of the source/drain regions is coupled to a sense amplifier by a conductive path 36 formed between the transistor and sense amplifier 50.

Figure 5:
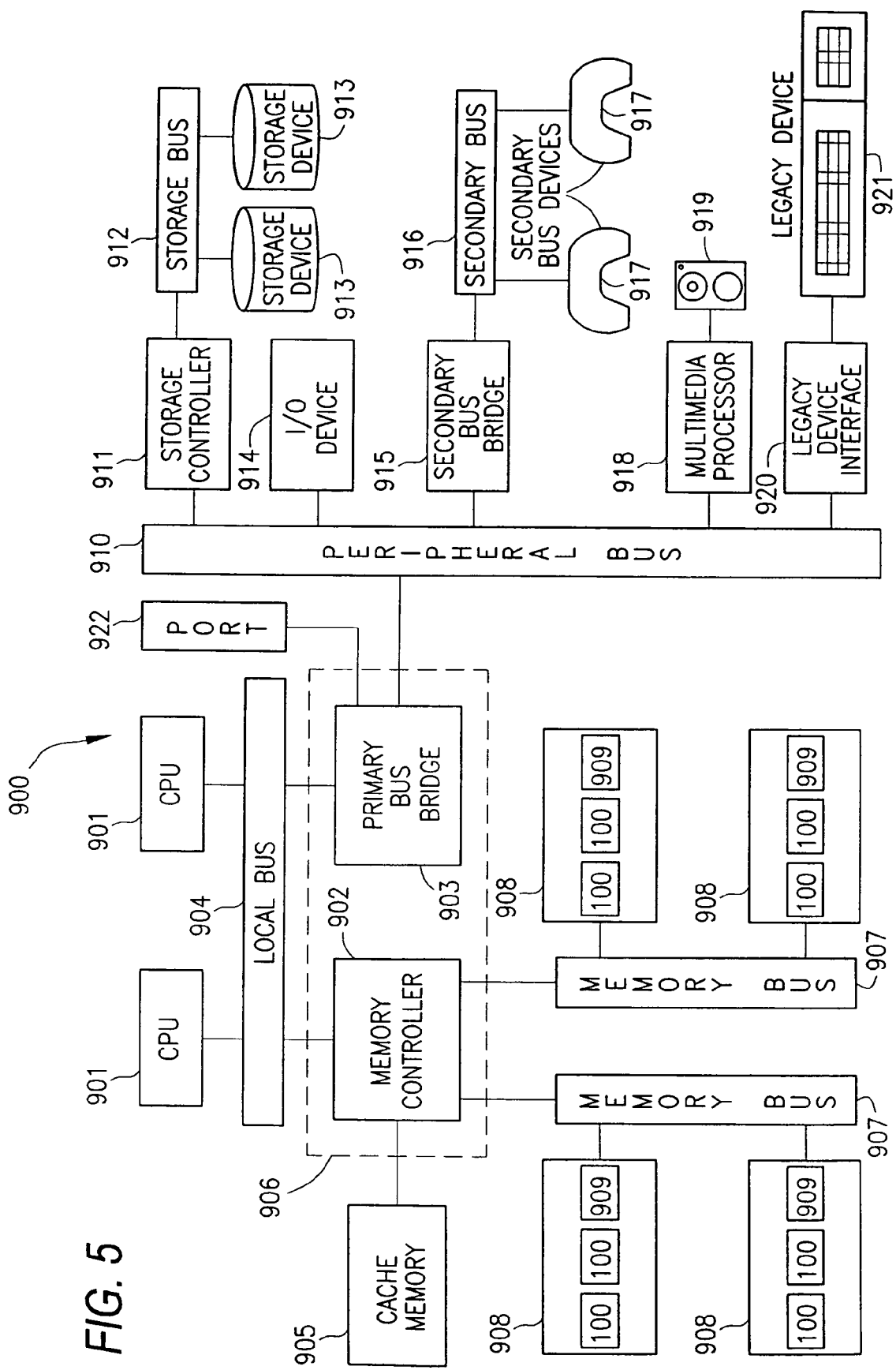
FIG. 5 is a block diagram representation of a processor-based system incorporating an MRAM device in accordance with the invention.

FIG. 5 illustrates an exemplary processing system 900, which may utilize the memory device 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 100 constructed in accordance with the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 900 to become more suitable for use in a variety of applications. For example, many electronic devices, which require processing may be implemented using a simpler architecture, which relies on a CPU 901, coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and accompanying drawings are only illustrative of an exemplary embodiment which can achieve the features and advantages of the present invention. For example, although the invention has been described as coupling an access transistor 16 to a sense amplifier 50 by way of a bit line 31, it should be noted that the memory device illustrated may have one sense amplifier 50 associated with each access transistor 16, or one sense amplifier 50 may be shared among access transistors 16 through a suitable decoding and switch arrangement. Other variations in the illustrated architecture are also possible. Thus, while the embodiment of the invention described above is illustrative, it is not intended that the invention be limited to the embodiments shown and described in detail herein. The invention can be modified to incorporate any number of variations, alterations, substitutions or equivalent arrangements not heretofore described, but which are commensurate with the spirit and scope of the invention. Accordingly, the invention is not limited by the foregoing description but is only limited by the scope of the following claims.

What is claimed as new and desired to be protected by Letters Patent of the United States is:

1. A method of reading a resistive memory device comprising a plurality of layers of resistive memory cells, each layer comprising an array of memory cells arranged in rows and columns, said method comprising:
   accessing a selected memory cell by activating a row line coupled to a first side of said selected memory cell and turning on a single access transistor which couples a second side of said selected memory cell and all of the memory cells in a same column of said layer as said selected memory cell, to a sense amplifier.

2. A method as in claim 1, wherein said resistive memory cells are MRAM memory cells.

3. A method as in claim 1 further comprising sensing a resistance value of a selected memory cell with said sense amplifier.

4. A method of reading from an array of resistive memory, comprising the acts of:
   selecting a desired memory cell in an X, Y, Z directional array of memory cells, memory cells arranged in Y-Z directions forming memory slices;

decoding an X direction of said desired memory cell; and activating a single access transistor associated with said memory slice, wherein said activated access transistor corresponds to said decoded X direction.

5. A method of reading from an array of resistive memory, comprising the acts of:

selecting a desired memory cell in an X, Y, Z directional array of memory cells, memory cells arranged in Y-Z directions forming memory slices;

decoding an Y-Z planar direction of said desired memory cell; and selecting a read/write row line associated with said Y-Z plane; and activating a single access transistor associated with said memory slice.

6. A method of reading from an array of resistive memory, comprising the acts of:

selecting a desired memory cell in an X, Y, Z directional array of memory cells, memory cells arranged in Y-Z directions forming memory slices;

decoding Y and Z directions of said desired memory cell; and selecting an read/write row line associated with said Y and Z directions; and activating a single access transistor associated with said memory slice.

7. A method of reading from an array of resistive memory, comprising the acts of:

enabling a single access transistor associated with a memory slice formed in the Y-Z direction containing a desired memory cell for reading;

coupling said memory slice to a sense amplifier; and coupling a non selected memory slice to said sense amplifier to use as a reference.

8. The method of reading of claim 7, further comprising the act of:

coupling said desired memory cell to a sense line.

9. The method of reading of claim 7, wherein said decoding further comprises:

determining a row, column and memory slice associated with said desired memory cell.

* * * * *